United States Patent
Choi

(10) Patent No.: US 7,314,831 B2
(45) Date of Patent: Jan. 1, 2008

(54) COPPER LINE OF SEMICONDUCTOR DEVICE AND METHOD FOR FORMING THE SAME

(75) Inventor: Chee Hong Choi, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/201,203

(22) Filed: Aug. 11, 2005

(65) Prior Publication Data

US 2006/0035461 A1  Feb. 16, 2006

(30) Foreign Application Priority Data

Aug. 13, 2004  (KR) .................. 10-2004-0064022

(51) Int. Cl.
*H01L 21/302*  (2006.01)
(52) U.S. Cl. ............................. 438/692; 257/E21.576
(58) Field of Classification Search ............... 438/691, 438/692; 257/E21.576
See application file for complete search history.

(56) References Cited

U.S. PATENT DOCUMENTS

| 5,552,638 A * | 9/1996 | O'Connor et al. ......... 257/759 |
| 5,886,410 A * | 3/1999 | Chiang et al. ............ 257/759 |
| 6,010,962 A * | 1/2000 | Liu et al. ................ 438/687 |
| 6,048,796 A * | 4/2000 | Wang et al. .............. 438/692 |
| 6,376,376 B1 * | 4/2002 | Lim et al. ................ 438/687 |
| 6,380,078 B1 * | 4/2002 | Liu et al. ................ 438/638 |
| 6,380,087 B1 * | 4/2002 | Gupta et al. ............. 438/692 |
| 6,583,027 B2 * | 6/2003 | Ota et al. ................ 438/424 |
| 6,815,332 B2 * | 11/2004 | San et al. ................ 438/623 |
| 2003/0003745 A1 * | 1/2003 | Wang et al. .............. 438/692 |

* cited by examiner

*Primary Examiner*—W. David Coleman
(74) *Attorney, Agent, or Firm*—McKenna Long & Aldridge LLP

(57) ABSTRACT

A copper line on a semiconductor device and a method for forming the same is disclosed, wherein an insulating layer is deposited so as to minimize the dishing of IMD without using a dummy area when performing the planarization process. The method of forming the copper line on the semiconductor device includes the steps of forming an IMD on a semiconductor substrate including a lower metal layer, forming an isolation layer on the IMD, exposing the lower metal layer by patterning the IMD and the isolation layer, forming a copper layer on the exposed lower metal layer and the isolation layer, and planarizing the copper layer.

4 Claims, 4 Drawing Sheets

COPPER LINE OF SEMICONDUCTOR DEVICE AND METHOD FOR FORMING THE SAME

CROSS-REFERENCE TO RELATED APPLICATIONS

This application claims the benefit of Korean Application No. P2004-64022 filed on Aug. 13, 2004, which is hereby incorporated by reference for all purposes as if fully set forth herein.

BACKGROUND OF THE INVENTION

1. Field of the Invention

The present invention relates to a copper line of a semiconductor device and a method for forming the same, and more particularly, to a copper line of a semiconductor device and a method for fabricating the same with a damascene process.

2. Discussion of the Related Art

Generally, a metal line of a semiconductor device is formed of a metal thin film such as aluminum, aluminum alloy or copper. The metal line is connected to a circuit formed on a semiconductor substrate through an electric connection and a pad contact.

According to the related art, a contact hole is formed by selectively etching through on insulating layer, and then a metal plug is formed by depositing barrier metal and tungsten in the contact hole. After that, a metal thin film is deposited and patterned on the metal plug, thereby forming the metal line used to contact the device electrode with the pad.

Generally, the metal line is patterned by photolithography. According to the trend for miniaturization of semiconductor devices, the critical dimension (CD) of the metal line decreases as the device size decreases. It is difficult to obtain small patterns for metal lines. To overcome this problem, it has been proposed to form small metal line patterns using a damascene process.

In a damascene process, a tungsten plug is formed in a contact hole then an upper insulating layer of oxide is formed over the insulating layer and the plug. The upper insulating layer is then patterned by photolithography to form the metal line patterns. A metal thin film is then formed inside the metal line patterns, and is subsequently planarized by CMP (Chemical Mechanical Polishing), to form a metal line layer.

FIGS. 1 to 3 are cross sectional views of illustrating some steps for fabricating a semiconductor device according to the related art.

As shown in FIG. 1, a lower metal layer 110 is formed on a semiconductor substrate 100, then an IMD (Inter Metal Dielectric) 125 is formed over the entire surface of the semiconductor substrate 100 and over lower metal layer 110. A copper layer is formed on the exposed lower metal layer 110 and the IMD 125, and is then planarized by CMP, thereby forming a copper line 145. However, according to this process, dishing 108 may be generated in the surface of the IMD 125 when performing the CMP step.

As shown in FIG. 2, an upper IMD 150 is formed on the IMD 125. However, when doing so, dishing 118 may be also generated in the surface of the upper IMD 150, wherein the dishing 118 formed in the surface of the upper IMD 150 is same in shape as the dishing 108 formed in the surface of the IMD 125.

Referring to FIG. 3, the copper line 145 is exposed by patterning the upper IMD 150, and then forming an upper copper layer on the exposed copper line 145 and the upper IMD 150. Upper copper line 175 is completed by another CMP step that planarizes the upper copper layer. When doing so, the copper residue 198 that is generated is collected on the surface of the upper IMD 150 due to the dishing 188. The presence of this copper residue on the surface of the upper IMD 150 is problematic because it causes the disconnection of the upper copper lines 175.

To prevent the disconnection of the copper line, the prior art uses a dummy area method. However, the dummy area method has the problem of increasing capacitive coupling and noise in a dummy area when being applied to a mixed signal technology.

SUMMARY OF THE INVENTION

Accordingly, the present invention is directed to a copper line in a semiconductor device and a method for forming the same that substantially obviates one or more problems due to limitations and disadvantages of the related art.

An advantage of the present invention is to provide a copper line of a semiconductor device and a method for forming the same, to minimize the dishing of IMD without a dummy area when performing the damascene process.

Additional advantages, and features of the invention will be set forth in part in the description which follows, and in part will be apparent from the description or may be learned from practice of the invention. The objectives and other advantages of the invention may be realized and attained by the structure particularly pointed out in the written description and claims hereof as well as the appended drawings.

To achieve these other advantages and in accordance with the purpose of the invention, as embodied and broadly described herein, a method for forming a copper line of a semiconductor device includes the steps of forming a lower metal layer on a semiconductor substrate, forming an IMD over said semiconductor substrate and over said lower metal layer, forming an isolation layer on the IMD, exposing the lower metal layer by patterning the IMD and the isolation layer, forming a copper layer on the exposed lower metal layer and the isolation layer, and planarizing the copper layer, wherein the isolation layer prevents dishing on the IMD.

The isolation layer is formed of silicon nitride and it is formed of a thickness of 500 Å to 1500 Å.

In another aspect, a copper line of a semiconductor device includes a lower metal layer on a semiconductor substrate, an IMD over said semiconductor substrate and over said lower metal layer, an isolation layer on the IMD, and a copper line on the IMD and the isolation layer, the copper line being connected with the lower metal layer, wherein the copper line is formed by CMP and no dishing results from the CMP process.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE INVENTION

Reference will now be made in detail to an embodiment of the present invention, example of which is illustrated in the accompanying drawings. Wherever possible, the same reference numbers will be used throughout the drawings to refer to the same or like parts.

Hereinafter, a method for forming a copper line of a semiconductor device according to the present invention will be described with reference to the accompanying drawings.

FIGS. 4 to 8 are cross sectional views illustrating a method for fabricating a semiconductor device according to one embodiment of the present invention.

Figure 1:
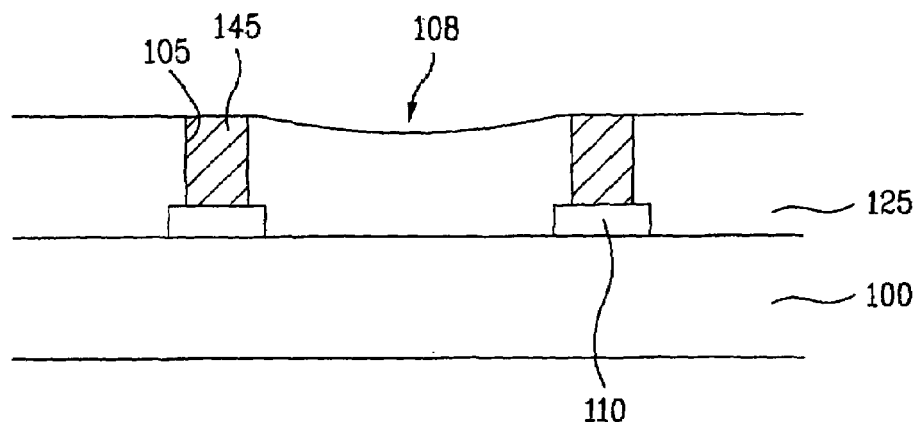
FIG. 1 to FIG. 3 are cross sectional views illustrating some steps for fabricating a semiconductor device according to the related art.
Figure 2:
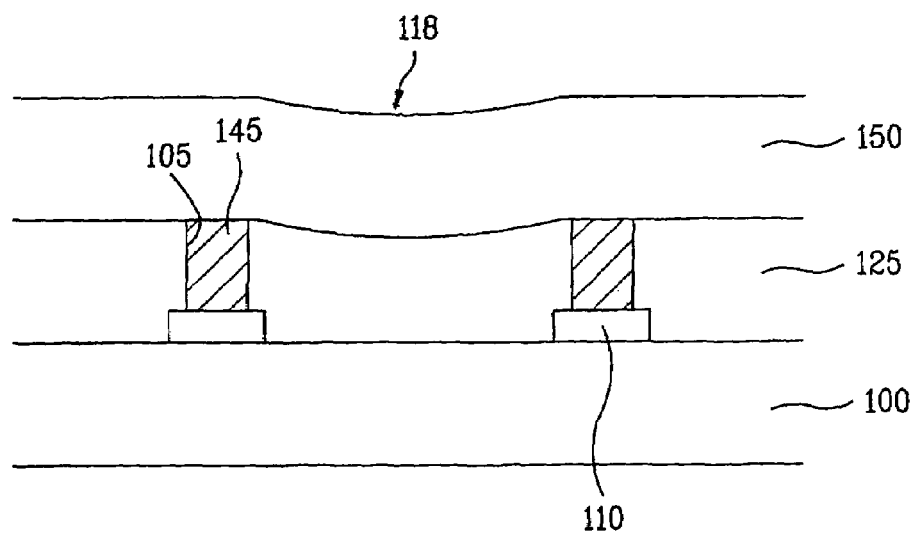
Figure 3:
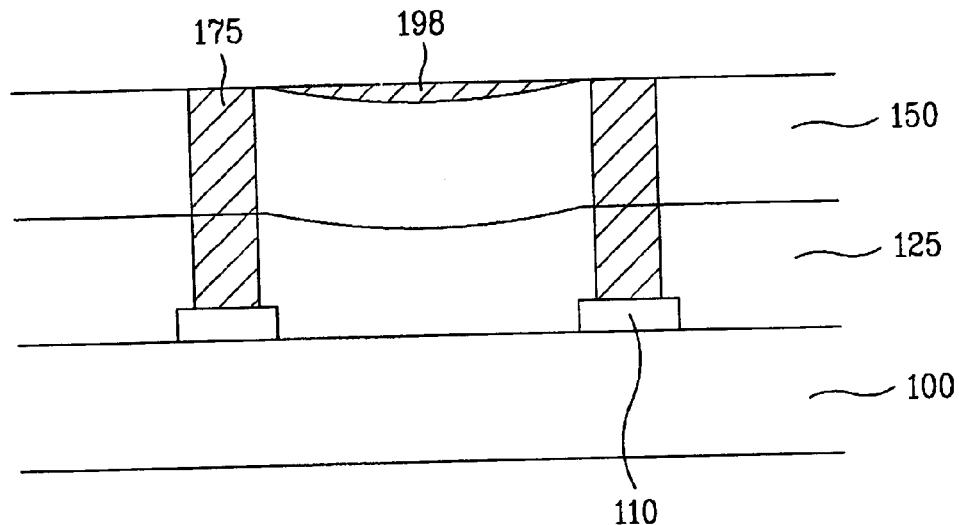
Figure 4:
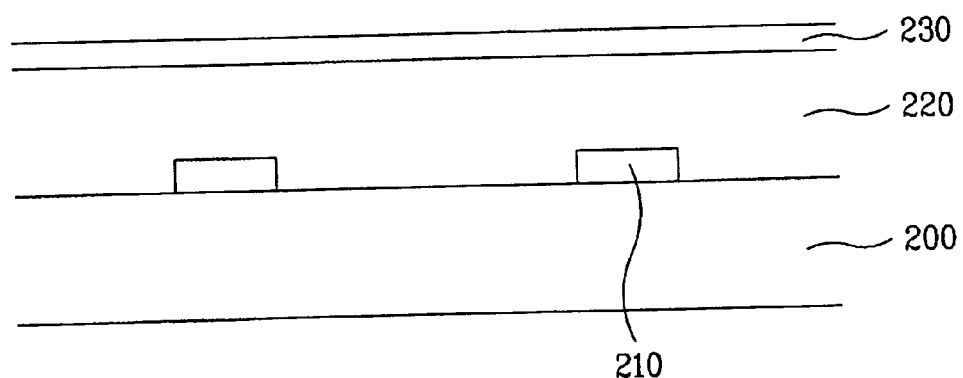
FIG. 4 to FIG. 8 are cross sectional views illustrating a method for fabricating a semiconductor device according to one preferred embodiment of the present invention.

As shown in FIG. 4, a lower metal layer 210 is formed on a semiconductor substrate 200, and then an IMD 220 is formed over the entire surface of the semiconductor substrate 200 and over the lower metal layer 210.

A silicon nitride isolation layer 230 is formed on the IMD 220. The isolation layer 230 has a thickness of approximately 500 Å to 1500 Å. The isolation layer 230 prevents dishing from being generated on the surface of the IMD 220 during the CMP step.

Figure 5:
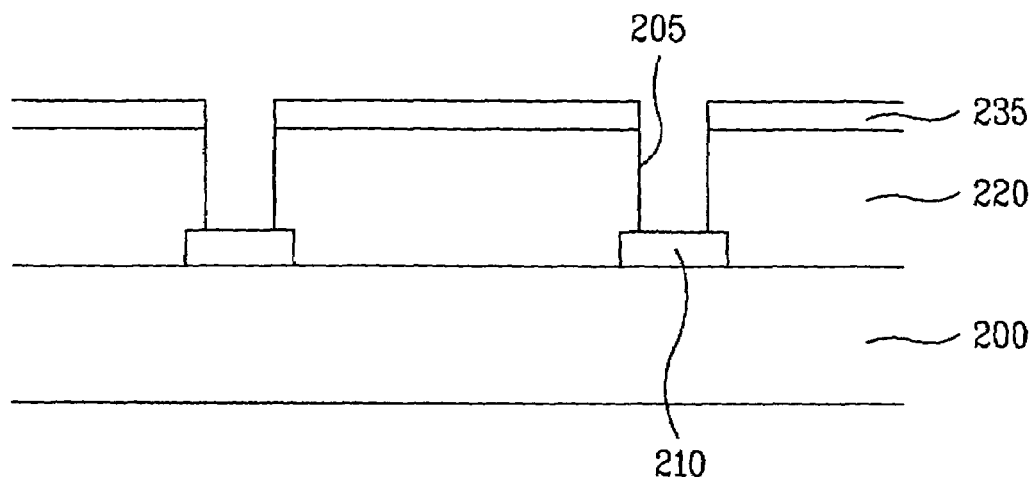

As shown in FIG. 5, the IMD 220 and the isolation layer 230 are etched to form a contact hole 205 to expose the lower metal layer 210 thereby forming IMD pattern 225 and isolation layer pattern 235. Patterning of the IMD 220 and the isolation layer 230 may be achieved by photolithography. During a photolithography step, a photoresist is formed over IMD 220 and insulating layer 230, it is patterned and then used as a mask to etch the underlying isolation layer 230 and IMD 220.

Figure 6:
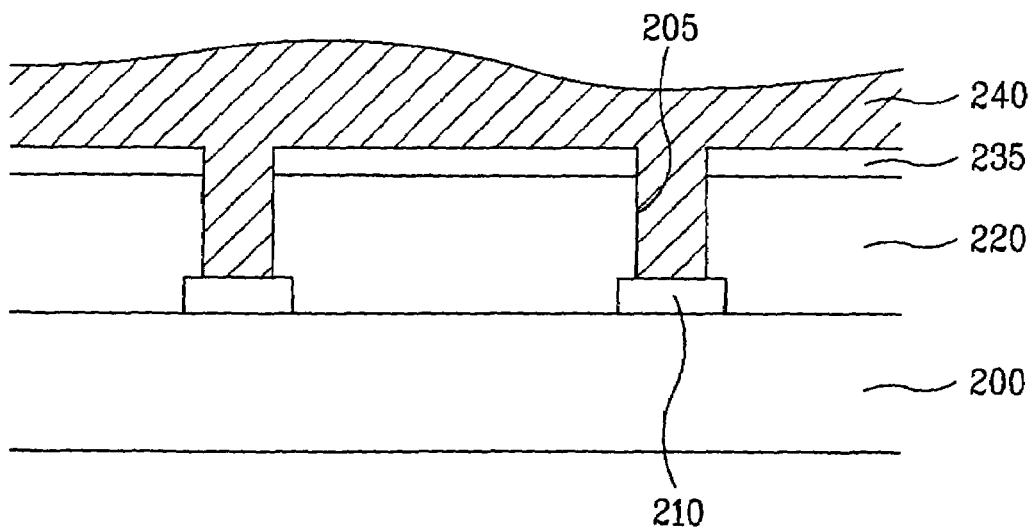

As shown in FIG. 6, a copper layer 240 is formed on the exposed lower metal layer 210 and over the isolation layer pattern 235.

Figure 7:
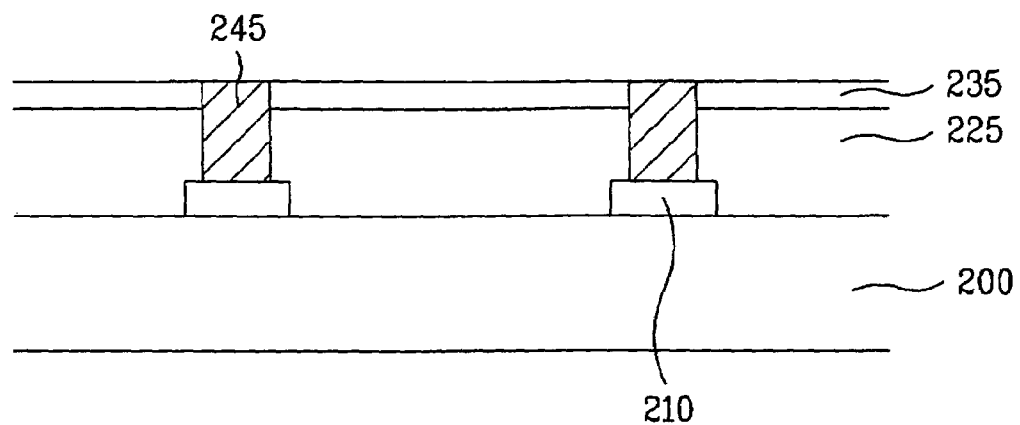

Next, as shown in FIG. 7, the copper layer 240 is planarized by CMP, thereby forming copper lines 245. Dishing is prevented by the isolation layer 235.

Figure 8:
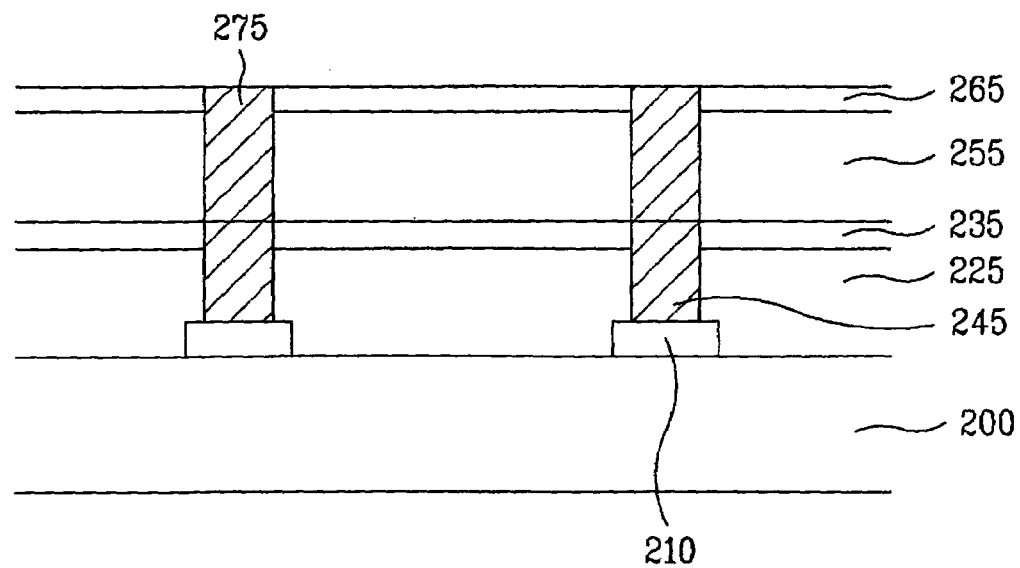

Referring to FIG. 8, an upper copper line 275 is formed. An upper IMD 255 and an upper isolation layer 265 are formed on the isolation layer pattern 235. As shown, the upper IMD and the upper isolation layer are patterned, thereby, forming upper contact holes that are then filled with copper to form copper lines 275 over copper lines 245. As previously done, the device is completed with planarization of the upper copper layer by a CMP step.

In one embodiment of the present invention, the isolation layer 230 is formed so as to prevent the dishing 108 from being generated in the surface of the IMD 220.

As mentioned above, the method for fabricating the copper line of the semiconductor device according to the present invention has the following advantages.

In the method for fabricating the copper line of the semiconductor device according to the present invention, the isolation layer is formed on the IMD used for the damascene process, thereby minimizing the dishing of the IMD. Thus, it is possible to prevent the disconnection of the copper line.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A method for forming a copper line of a semiconductor device comprising:

forming a lower metal layer on a semiconductor substrate;

forming an IMD over said semiconductor substrate and over said lower metal layer;

forming a single isolation layer on the IMD;

exposing the lower metal layer by patterning the IMD and the isolation layer;

forming a copper layer on the exposed lower metal layer and the isolation layer, the copper layer being in direct contact with the lower metal layer; and planarizing the copper layer while using the isolation layer to prevent dishing on the IMD.

2. The method of claim 1, wherein the isolation layer is formed of silicon nitride.

3. The method of claim 1, wherein the isolation layer is formed of a thickness of 500 Å to 1500 Å.

4. A copper line of a semiconductor device comprising:

a lower metal layer on a semiconductor substrate;

an IMD over said semiconductor substrate and over said lower metal layer;

an isolation layer on the IMD; and a copper line through the IMD and the isolation layer, the copper line being in direct contact with the lower metal layer, wherein the copper line is formed by CMP and no dishing on the IMD results from the CMP process.

* * * * *